(12) United States Patent
Walton et al.

(10) Patent No.: US 10,695,763 B2
(45) Date of Patent: Jun. 30, 2020

(54) FLUID EXTRACTION FROM A MICROFLUIDIC DEVICE

(71) Applicant: Sharp Life Science (EU) Limited, Oxford (GB)

(72) Inventors: Emma Jayne Walton, Oxford (GB); Lesley Anne Parry-Jones, Oxford (GB); Christopher James Brown, Oxford (GB)

(73) Assignee: Sharp Life Science (EU) Limited, Oxford (GB)

( * ) Notice: Subject to any disclaimer, the term of this patent is extended or adjusted under 35 U.S.C. 154(b) by 366 days.

(21) Appl. No.: 15/728,188

(22) Filed: Oct. 9, 2017

(65) Prior Publication Data

US 2018/0104695 A1 Apr. 19, 2018

(30) Foreign Application Priority Data

Oct. 19, 2016 (EP) .................................. 16194633

(51) Int. Cl.
*B01L 3/00* (2006.01)
*H01L 27/12* (2006.01)
*F16K 99/00* (2006.01)

(52) U.S. Cl.
CPC ..... *B01L 3/502784* (2013.01); *B01L 3/50273* (2013.01); *B01L 3/502792* (2013.01);
(Continued)

(58) Field of Classification Search
CPC ......... B01L 3/502784; B01L 3/502792; B01L 3/50273; B01L 2300/0816;
(Continued)

(56) References Cited

U.S. PATENT DOCUMENTS 9,132,400 B2 9/2015 Vann et al.
2009/0014394 A1 1/2009 Yi et al.
(Continued)

OTHER PUBLICATIONS

Extended European Search Report of EP Application No. 16194633.0 dated May 4, 2017, 11 pages.
(Continued)

*Primary Examiner* — J. Christopher Ball
(74) *Attorney, Agent, or Firm* — Renner, Otto, Boisselle & Sklar, LLP

(57) ABSTRACT

A method of extracting assay fluid from an EWOD device, the EWOD device comprising two opposing substrates defining a fluid space there between and an aperture for extraction of fluid from the fluid space. The method comprises providing, in the fluid space of the EWOD device, a droplet of assay fluid adjacent to the aperture such that the droplet blocks extraction, via the aperture, of filler fluid contained in the fluid space of the EWOD device, and extracting, via the aperture, at least some of the assay fluid of the droplet from the fluid space. The method comprises, during the extracting, controlling the assay fluid droplet by electrowetting to maintain the blocking of extraction of filler fluid. By controlling the position of the unextracted portion of the assay fluid droplet relative to the aperture during the extraction process, the unextracted portion of the assay fluid droplet continues to block extraction of filler fluid. This makes it much less likely for unwanted extraction of filler fluid to occur.

16 Claims, 16 Drawing Sheets

(52) U.S. Cl.
CPC .......... *B01L 2200/0673* (2013.01); *B01L 2300/0816* (2013.01); *B01L 2400/0427* (2013.01); *F16K 99/0017* (2013.01); *H01L 27/1214* (2013.01)

(58) Field of Classification Search
CPC ..... B01L 2200/0673; B01L 2400/0427; B01L 3/502707; B01L 2200/12; F16K 99/0017; H01L 27/1214
See application file for complete search history.

(56) References Cited

U.S. PATENT DOCUMENTS

| | | |
|---|---|---|
| 2010/0000620 A1 | 1/2010 | Fouillet et al. |
| 2015/0008129 A1 | 1/2015 | Vann et al. |
| 2015/0075985 A1 | 3/2015 | Pollack et al. |

OTHER PUBLICATIONS

"Digital microfluidics: is a true lab-on-a-chip possible?", R.B. Fair, Microfluid Nanofluid (2007) 3:245-281).

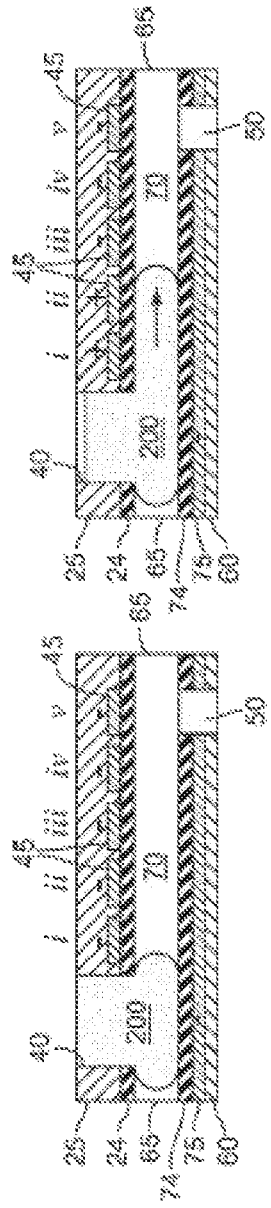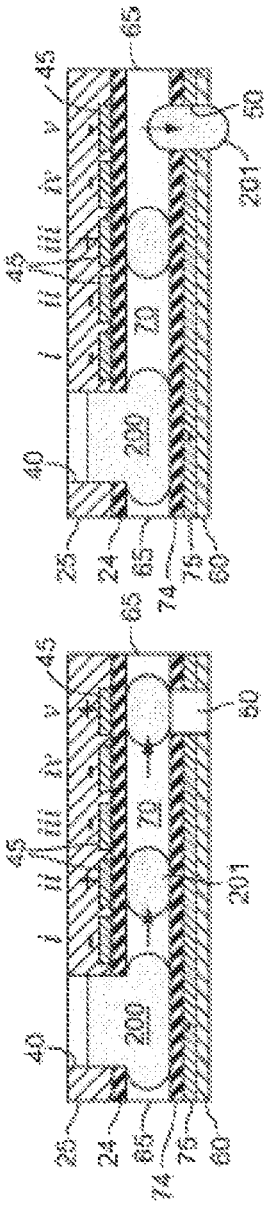

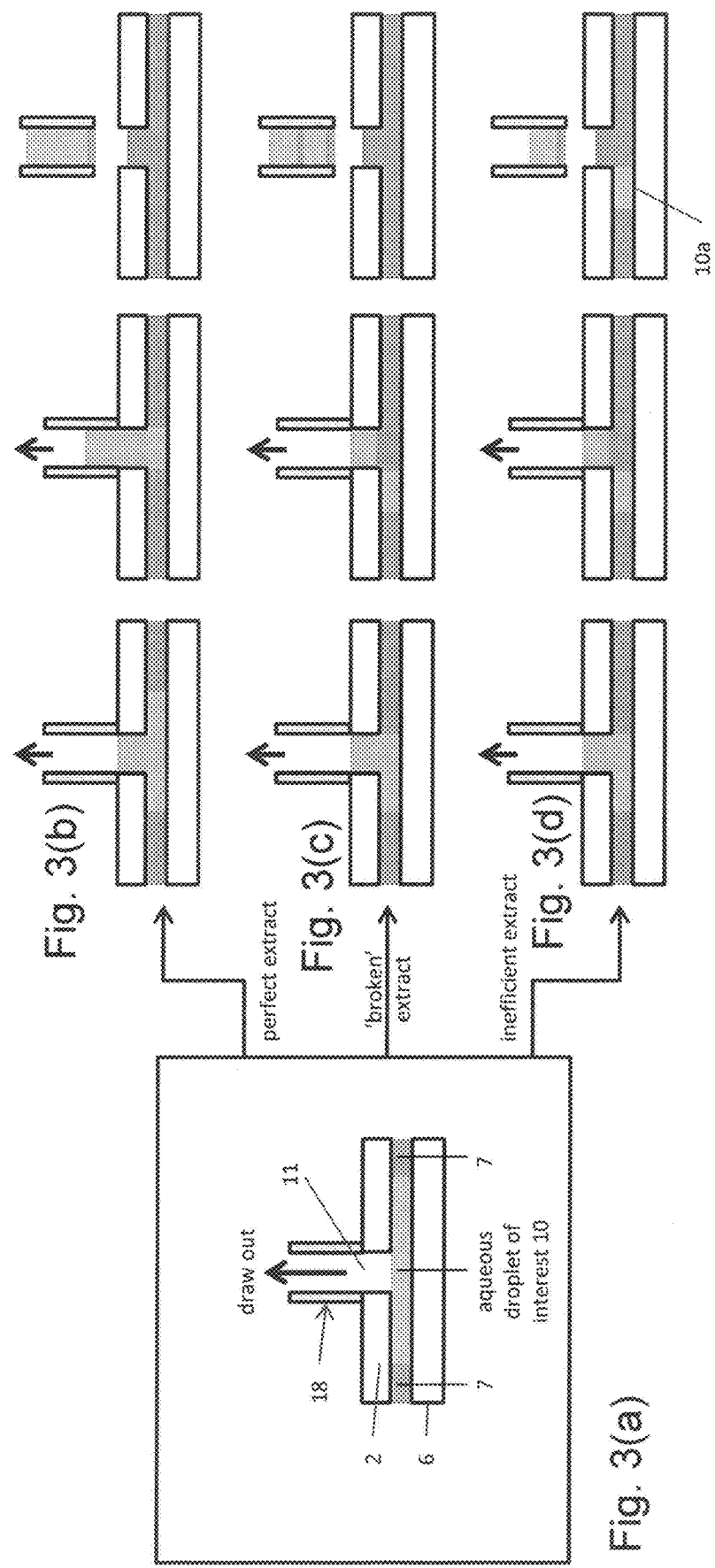

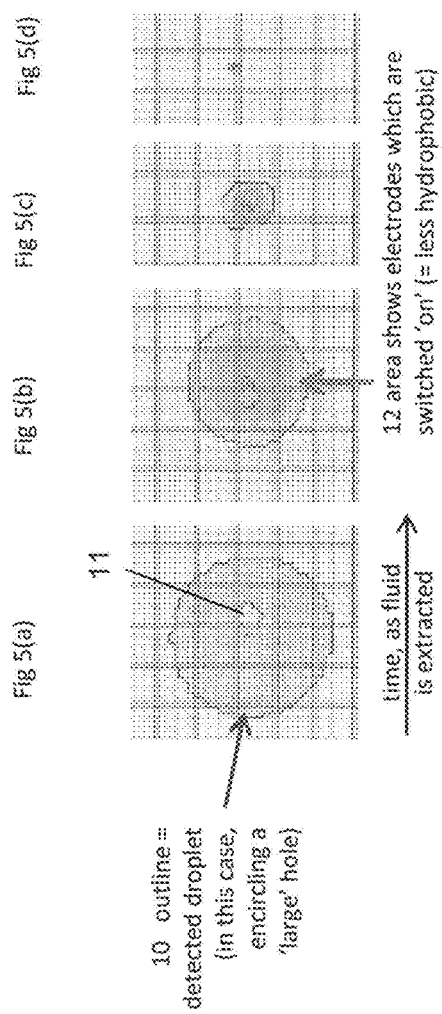

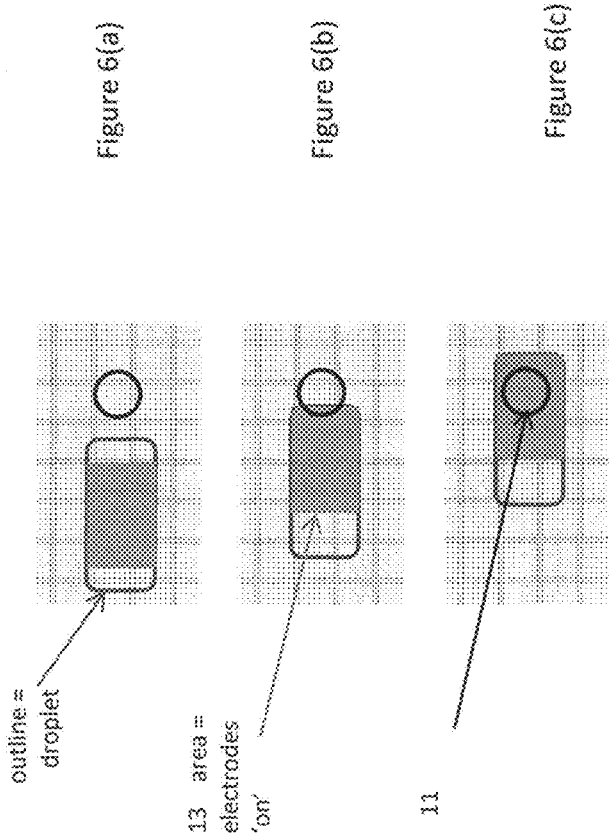

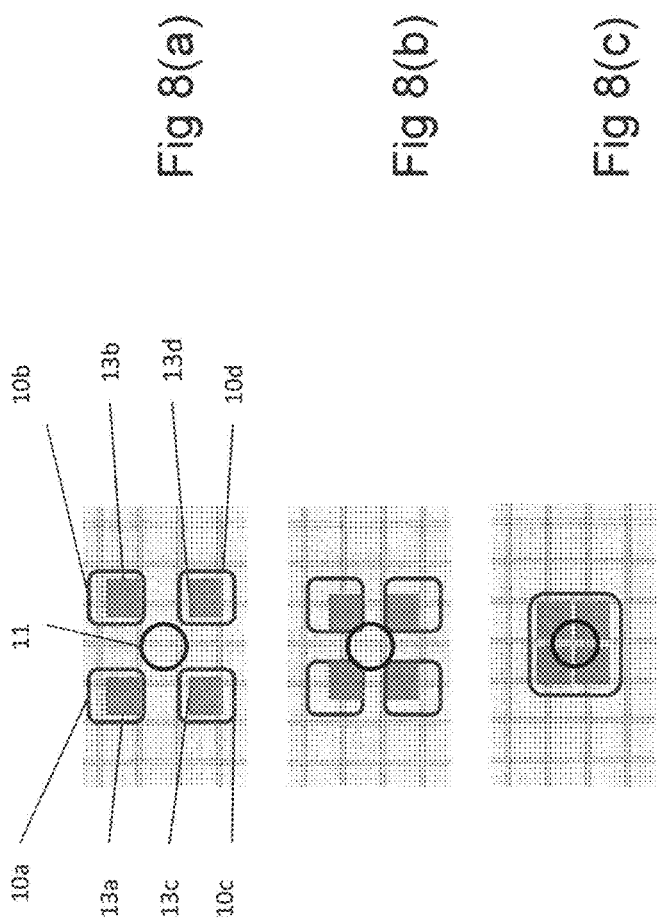

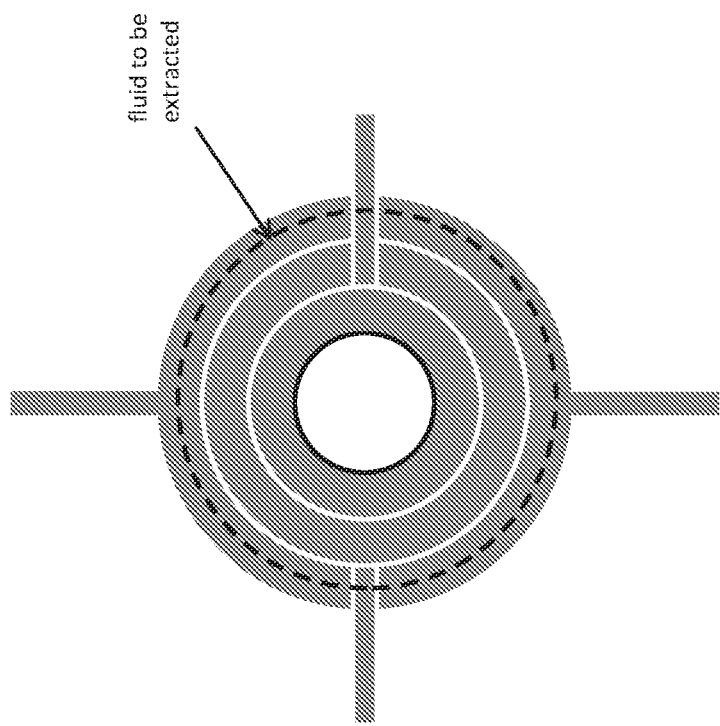
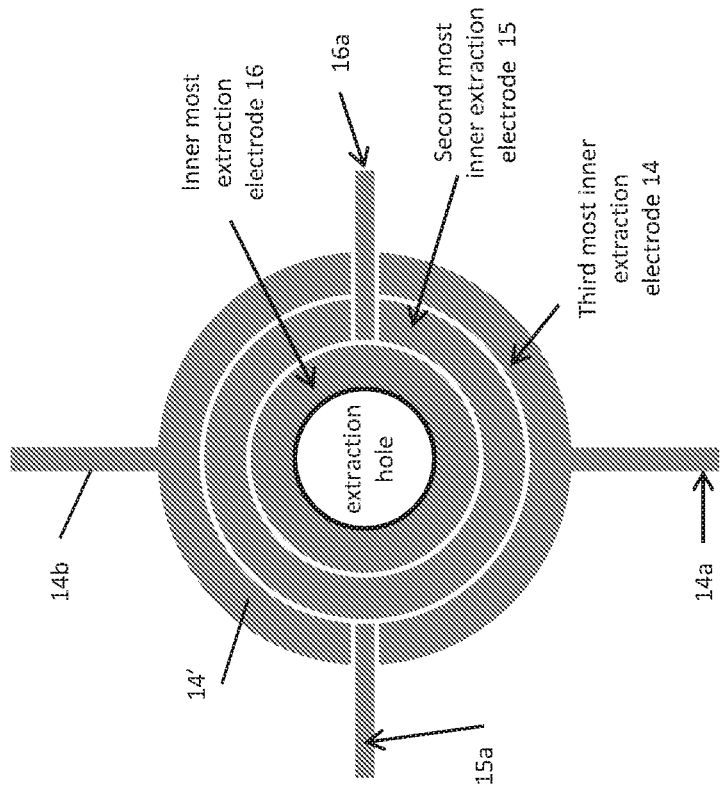

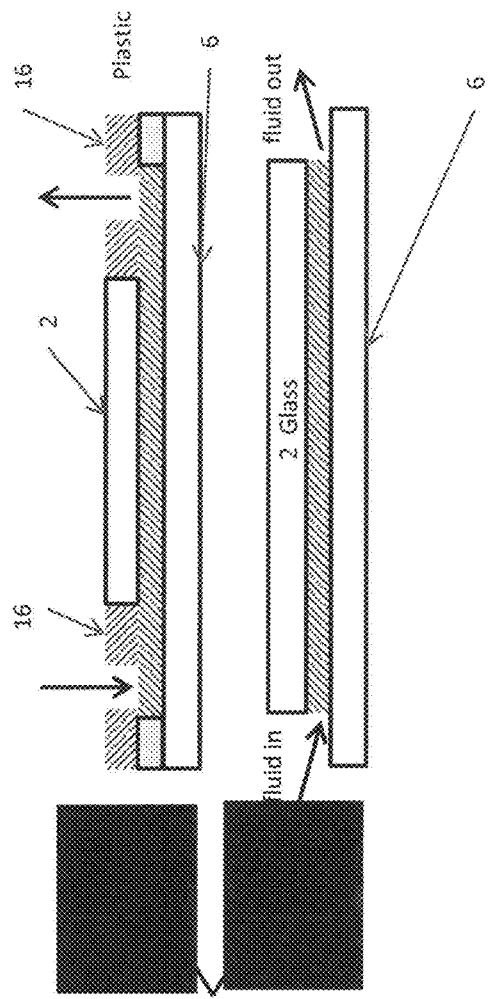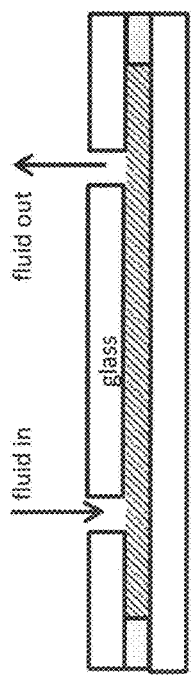

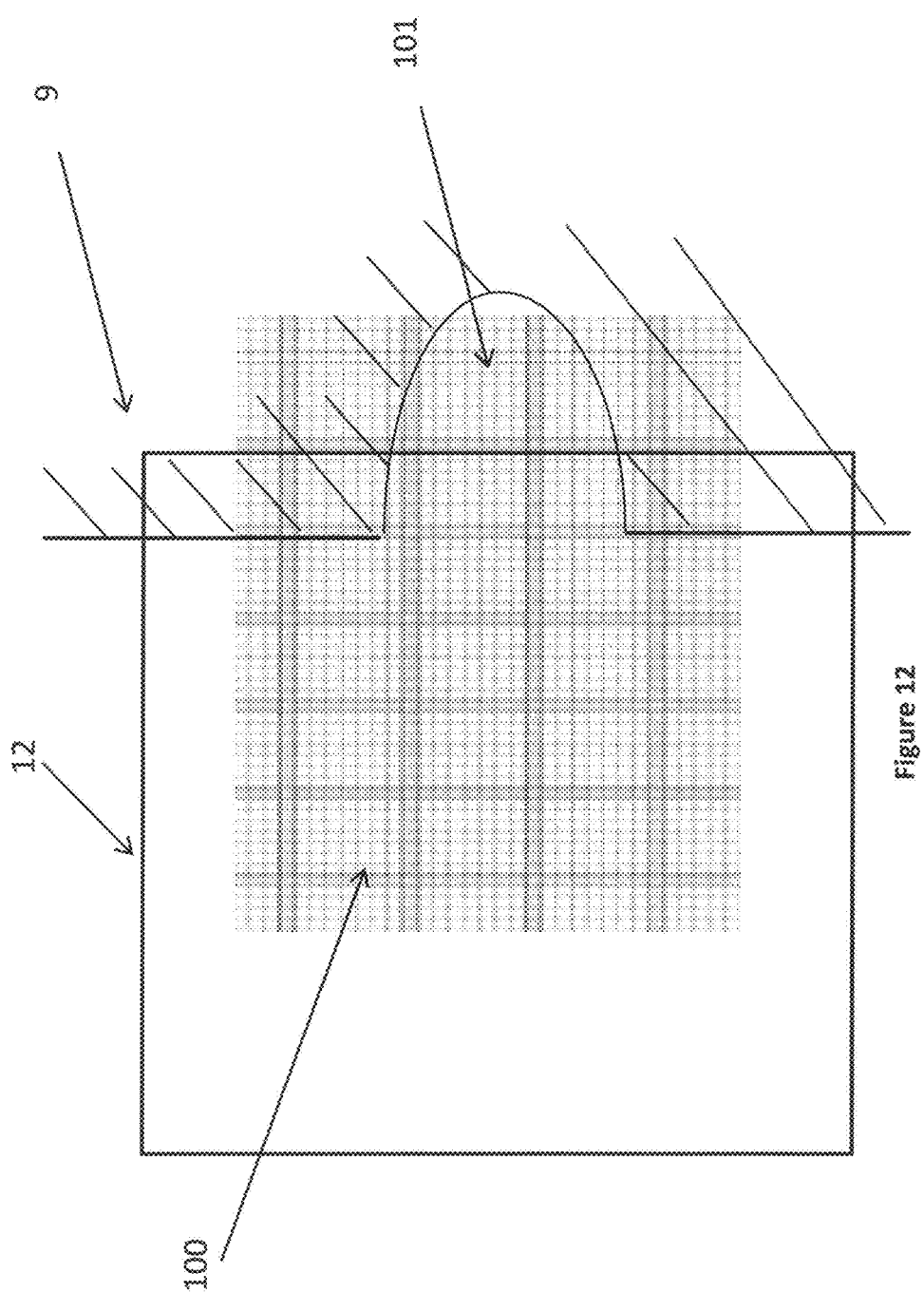

FLUID EXTRACTION FROM A MICROFLUIDIC DEVICE

TECHNICAL FIELD

The present invention relates to extracting fluid from a microfluidic device, and more particularly to extracting fluid from an Active Matrix Electro-wetting on Dielectric (AM-EWOD) microfluidic device. Electro-wetting-On-Dielectric (EWOD) is a known technique for manipulating droplets of fluid on an array. Active Matrix EWOD (AM-EWOD) refers to implementation of EWOD in an active matrix array incorporating transistors, for example by using thin film transistors (TFTs).

BACKGROUND OF THE INVENTION

Microfluidics is a rapidly expanding field concerned with the manipulation and precise control of fluids on a small scale, often dealing with sub-microlitre volumes. There is growing interest in its application to chemical or biochemical assay and synthesis, both in research and production, and applied to healthcare diagnostics ("lab-on-a-chip"). In the latter case, the small nature of such devices allows rapid testing at point of need using much smaller clinical sample volumes than for traditional lab-based testing.

A microfluidic device can be identified by the fact that it has one or more channels (or more generally gaps) with at least one dimension less than 1 millimetre (mm). Common fluids used in microfluidic devices include whole blood samples, bacterial cell suspensions, protein or antibody solutions and various buffers. Microfluidic devices can be used to obtain a variety of interesting measurements including molecular diffusion coefficients, fluid viscosity, pH, chemical binding coefficients and enzyme reaction kinetics. Other applications for microfluidic devices include capillary electrophoresis, isoelectric focusing, immunoassays, enzymatic assays, flow cytometry, sample injection of proteins for analysis via mass spectrometry, PCR amplification, DNA analysis, cell manipulation, cell separation, cell patterning and chemical gradient formation. Many of these applications have utility for clinical diagnostics.

Many techniques are known for the manipulation of fluids on the sub-millimetre scale, characterised principally by laminar flow and dominance of surface forces over bulk forces. Most fall into the category of continuous flow systems, often employing cumbersome external pipework and pumps. Systems employing discrete droplets instead have the advantage of greater flexibility of function.

Electro-wetting on dielectric (EWOD) is a well-known technique for manipulating discrete droplets of fluid by application of an electric field. It is thus a candidate technology for microfluidics for lab-on-a-chip technology. An introduction to the basic principles of the technology can be found in "Digital microfluidics: is a true lab-on-a-chip possible?" (R. B. Fair, Microfluid Nanofluid (2007) 3:245-281). This review notes that methods for introducing fluids into the EWOD device are not discussed at length in the literature. It should be noted that this technology employs the use of hydrophobic internal surfaces. In general, therefore, it is energetically unfavourable for aqueous fluids to fill into such a device from outside by capillary action alone. Further, this may still be true when a voltage is applied and the device is in an actuated state. Capillary filling of non-polar fluids (e.g. oil) may be energetically favourable due to the lower surface tension at the liquid-solid interface.

An Electrowetting-on-Dielectric (EWOD) device or other microfluidic device can be used to meter and mix fluids together, either to perform an assay within the device (this requires some kind of read-out, e.g. optical, electrical), or prepare a sample to be analysed elsewhere using a different kind of reader. In the latter case, one or more droplets must be 'extracted' from the device. Currently this is most often done by pipette through a hole in the upper substrate. However, while this extraction method is suitable for use by a trained worker in laboratory conditions it is not reliable in general use.

U.S. Pat. No. 9,132,400 proposes a method of dispensing liquid for use in biological analysis that comprises positioning liquid to be dispensed through electrowetting. This is illustrated in FIG. 2. A loader has an upper substrate 25 covered by a hydrophobic insulator layer 24 with electrical pads 45 disposed between the substrate 25 and the layer 24, and has a lower substrate 60 covered by a hydrophobic insulator layer 74 with an electrode 75 disposed between the lower substrate 60 and the layer 74. The substrates are spaced from one another and sealed with a seal 65. An input port 40 is provided in the upper substrate 25 to permit loading of fluid 200 into the chamber 70 of the loader. At least one opening 50 is provided in the lower substrate 25. U.S. Pat. No. 9,132,400 proposes that the electrical charge of the electrical pads 45 and the electrode 75 may be controlled so as to move liquid in a single direction within the chamber to be positioned in alignment with an opening 50 for dispensing therethrough as indicated by droplet 201.

SUMMARY OF INVENTION

A first aspect of the present invention provides a method of extracting assay fluid from an EWOD device, the EWOD device comprising two opposing substrates defining a fluid space there between and an aperture for extraction of fluid from the fluid space. The method comprises: providing, in the fluid space of the EWOD device, a droplet of assay fluid adjacent to the aperture such that the droplet blocks extraction, via the aperture, of filler fluid contained in the fluid space of the EWOD device, and extracting, via the aperture, at least some of the assay fluid of the droplet from the fluid space; wherein the method comprises, during the extracting, controlling the unextracted portion of the assay fluid droplet by electrowetting to maintain the blocking of extraction, via the aperture, of filler fluid.

Initially the droplet of assay fluid will completely encircle the aperture, and so will completely block extraction of filler fluid via the aperture—the droplet blocks the aperture against filler fluid. As assay fluid is extracted the unextracted portion of the assay fluid droplet will decrease in size—but, in the invention, the position of the unextracted portion of the assay fluid droplet, relative to the aperture is controlled, so that the unextracted portion of the assay fluid droplet continues completely to encircle the aperture and so maintain the complete blocking of extraction of filler fluid. This makes it much less likely for unwanted extraction of filler fluid to occur. The invention can in principle maintain complete blocking of extraction of filler fluid until the unextracted portion of the assay fluid droplet eventually becomes too small to completely encircle the aperture. Even when this point in the extraction process is reached, however, control of the position of the unextracted portion of the assay fluid droplet according to the invention may still be used maintain contact between the unextracted portion of the assay fluid droplet and extracted assay fluid, and thus continue to block extraction of filler fluid through the aperture (maintaining contact between the unextracted portion of the assay fluid and aqueous fluid that has already been extracted from the device will prevent filler fluid from being extracted instead of aqueous fluid).

The method may comprise, during the extracting, controlling the assay fluid droplet by electrowetting so as to keep the centre of the assay fluid droplet substantially at a predetermined position relative to the aperture. As an example the centre of the assay fluid droplet may be kept substantially coincident (in the plane of the device) with the centre of the aperture, although the invention is not limited to this.

The EWOD device may comprise a plurality of electrowetting electrodes, and the method may comprise selectively actuating the electrowetting electrodes during the extracting to maintain the blocking of extraction of filler fluid.

The method may comprise, during the extracting, varying the pattern of actuated electrodes over time to maintain the blocking of extraction of filler fluid.

The method may comprise, during the extracting, varying the pattern of actuated electrodes over time in a predetermined manner.

Alternatively, the method may comprise, during the extracting, varying the pattern of actuated electrodes over time in dependence on a sensed position and/or size of the assay fluid droplet.

Providing the droplet of assay fluid may comprise moving assay fluid to the vicinity of the aperture by electrowetting.

The method may comprise moving the assay fluid by actuating electrodes within an area that is smaller than the area of the assay fluid droplet.

The method may comprise moving the assay fluid by actuating electrodes within an area having a dimension parallel to a direction of movement of the assay fluid that is greater than a dimension perpendicular to the direction of movement of the assay fluid.

Providing the droplet of assay fluid may comprise moving a plurality of sub-droplets of assay fluid to the vicinity of the aperture and merging the sub-droplets to form the droplet for blocking extraction of filler fluid via the aperture.

The method may comprise introducing additional filler fluid into the fluid space of the EWOD device before the extracting.

A second aspect of the invention provides an EWOD device comprising: two opposing substrates defining a fluid space therebetween; an aperture for extraction of fluid from the fluid space; a plurality of independently actuatable electrowetting electrodes; and an electrode control unit; wherein the control unit is adapted to actuate the electrodes so as to: provide, in the fluid space of the EWOD device, a droplet of assay fluid adjacent to the aperture such that the droplet blocks extraction of filler fluid contained in the fluid space of the EWOD device, and control the assay fluid droplet by electrowetting during extraction, via the aperture, of at least some of the assay fluid of the droplet from the fluid space so as to maintain the blocking of extraction of filler fluid.

The aperture may be in one of the substrates of the EWOD device or the aperture may be at a side of the EWOD device.

The EWOD device may comprise active matrix electrowetting electrodes, or it may comprise passive matrix electrowetting electrodes.

A third aspect of the invention provides a method of moving an assay fluid droplet within an EWOD device, the EWOD device comprising two opposing substrates defining a fluid space therebetween, at least one of the substrates having electrowetting electrodes provided thereon. The method comprises moving an assay fluid droplet by actuating electrowetting electrodes within an area that is smaller than the area of the assay fluid droplet. It has been found that this improves the degree of control that can be exerted over the movement and positioning of the assay fluid droplet.

A fourth aspect of the invention provides a method of moving an assay fluid droplet within an EWOD device, the EWOD device comprising two opposing substrates defining a fluid space therebetween, at least one of the substrates having electrowetting electrodes provided thereon. The method comprises actuating electrowetting electrodes within an area having a dimension parallel to a desired direction of movement of the assay fluid droplet that is greater than a dimension perpendicular to the direction of movement of the assay fluid droplet. It has been found that this improves the degree of control that can be exerted over the movement and positioning of the assay fluid droplet.

The third and fourth aspects may if desired be combined, by actuating electrowetting electrodes within an area that (1) has a dimension parallel to a desired direction of movement of the assay fluid droplet that is greater than a dimension perpendicular to the direction of movement of the assay fluid droplet and (2) is smaller than the area of the assay fluid droplet.

BRIEF DESCRIPTION OF FIGURES

To the accomplishment of the foregoing and related ends, the invention comprises the features hereinafter fully described and identified in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

FIGS. 2A, 2B, 2C, and 2D are schematic diagrams illustrating fluid manipulation in U.S. Pat. No. 9,132,400;

FIG. 3(a)-3(b) are schematic section view illustrating ideal extraction of fluid from a microfluidic device;

FIGS. 3(c)-3(d) are schematic section view illustrating problems that may occur in extracting fluid from a microfluidic device;

FIGS. 5(a), 5(b), 5(c), and 5(d) are schematic plan views illustrating a method of the present invention of positioning fluid for extraction;

FIGS. 6(a), 6(b), and 6(c) are schematic plan views illustrating another method of the present invention of positioning fluid for extraction;

FIGS. 8(a), 8(b), and 8(c) are schematic plan views illustrating another method of the present invention of positioning fluid for extraction;

FIGS. 9(a) and 9(b) are schematic plan views illustrating a fluid extraction method of the present invention;

FIGS. 10(a), 10(b), and 10(c) are schematic sectional views illustrating further embodiments of the invention.

FIG. 12 is a plan view schematic showing a microfluidic device illustrating a side extraction structure;

DETAILED DESCRIPTION

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

Figure 1:
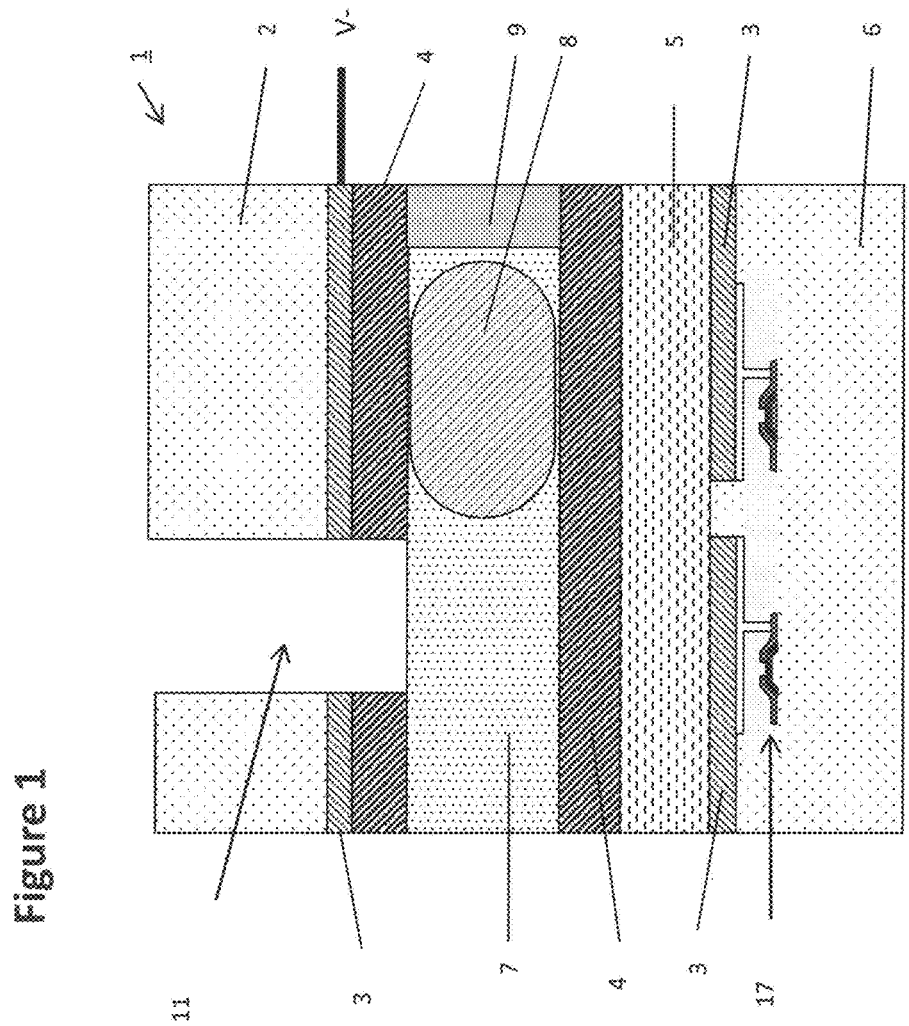
FIG. 1 is a schematic diagram depicting a conventional AM-EWOD device.

FIG. 1 is a schematic diagram depicting a conventional AM-EWOD device 1 in cross-section. The AM-EWOD device 1 has a lower substrate 6, which is typically (but not necessarily) made from glass, and acts as a support for a thin film electronic structure (e.g. an array of thin film transistors 17) made from low temperature polysilicon (LTPS), and constructed using a standard display manufacturing process. The device 1 also has an upper substrate 2, which is typically (but not necessarily) made from glass. Electrodes 3 are disposed upon the upper and lower substrates 2, 6, and are typically (but not necessarily) made from either a transparent conductor (such as indium tin oxide (ITO)) or a reflective conductor (such as aluminium). The electrodes 3 will subsequently be used to control the movement of liquid droplets 8 through the device 1, for example by electrowetting. (As is well known, "electrowetting" denotes the use of an applied electric field to alter the contact properties (or "wetting") between a liquid droplet and a surface (which may be hydrophobic.) The lower substrate 6 may further be provided with an insulator layer 5.

The inner surfaces of the upper 2 and lower substrates 6 may have a hydrophobic coating 4. Non-limiting examples of materials that may be used to form the hydrophobic coating include several fluoropolymers or polymers such as TEFLON AF1600, CYTOP, FLUROPEL, PARYLENE C and PARALENE HT.

A fluid space is defined between the upper substrate 2 and the lower substrate 6. A spacer 9 maintains a suitably sized and well-controlled spacing between the upper 2 and lower substrates 6. In some cases it can also form a continuous seal around the perimeter of the device, which helps to contain fluids that will subsequently be introduced into the device.

The upper substrate 2 may have formed within it one or more apertures 11 which provide a means of fluids entering and/or exiting the device, for example in the case where the spacer 9 acts as a continuous seal around the perimeter of the device. In the case where the spacer 9 does not form a continuous seal around the perimeter of the device, fluids can enter and exit the device laterally and there is no need for apertures within the upper substrate 2.

A liquid droplet 8, which may consist of any polar liquid and which typically may be ionic and/or aqueous, is enclosed between the lower substrate 6 and the upper substrate 2, although it will be appreciated that multiple liquid droplets 8 can be present. The content of the liquid droplet will be referred to herein as "assay fluid" for convenience but, as explained below, this does not mean that the invention is limited to use in performing an assay.

During normal device operation, the droplets of assay fluid 8 are typically surrounded by a non-polar filler fluid 7, which could be an oil, for example dodecane, other alkane or silicone oil, or alternatively air. A key requirement of the filler fluid is that it is immiscible with the assay fluid(s).

A general requirement for the operation of the device is that the assay fluid comprises a polar fluid, typically a liquid, that may be manipulated by electro-mechanical forces, such as the electro-wetting force, by the application of electrical signals to the electrodes.

Typically, but not necessarily, the assay fluid may comprise an aqueous material, although non-aqueous assay fluids (e.g. ionic liquids) may also be manipulated. Typically, but not necessarily, the assay fluid may contain a concentration of dissolved salts, for example in the range 100 nM-100M or in the range 1 uM to 10M or in the range 10 uM to 1M or in the range 100 uM to 100 mM or in the range 1 mM to 10 mM.

Optionally, either the assay fluid or the filler fluid may contain a quantity of surfactant material, which may be beneficial for reducing the surface tension at the interface between the droplet and the filler fluid. The addition of a surfactant may have further benefits in reducing or eliminating unwanted physical or chemical interactions between the assay liquid and the hydrophobic surface. Non-liming examples of surfactants that may be used in electro-wetting on dielectric systems include various ionic or cationic surfactants such as BRIJ 020, BRIJ 58, BRIJ S100, BRIJ S10, BRIJ S20, TETRONIC 1107, IGEPAL CA-520, IGEPAL CO-630, IGEPAL DM-970, MERPOL OJ, PLURONIC F108, PLURONIC L-64, PLURONIC F-68, PLURONIC P-105, PLURONIC F-127, PLURONIC P-188, TWEEN-20, SPAN-20, SPAN-80, TWEEN-40, TWEEN-60.

Whilst the term assay is generally taken to refer to some analytical procedure, method or test, the term assay fluid in the scope of this invention may be taken more widely to refer to a fluid involved in any chemical or biochemical processes as may be performed on the AM-EWOD device, for example, but not limited to the following:

A laboratory test for testing for the presence, absence or concentration of some molecular or bio-molecular species, for example a molecule, a protein, a sequence of nucleic acid etc.

A medical or bio-medical test for testing for the presence, absence or concentration of some physiological fluid, species or substance, for example a medical diagnostic test A procedure for preparing a material sample, for example the extraction, purification and/or amplification of a biochemical species, including but not limited to, a nucleic acid, a protein from a sample, a single cell from a sample A procedure for synthesising a chemical or bio-chemical compound, including, but not limited to the examples of a protein, a nucleic acid, a pharmaceutical product or a radioactive tracer.

Here, and elsewhere, the invention has been described with regard to an Active Matrix Electro-wetting on dielectric device (AM-EWOD). It will be appreciated however that the invention, and the principles behind it, are equally applicable to a 'passive' EWOD device, whereby the electrodes are driven by external means, as is well known in prior art (e.g. R. B. Fair, Microfluid Nanofluid (2007) 3:245-281). Likewise, in this and subsequent embodiments the invention has been described in terms of an AM-EWOD device utilizing thin film electronics to implement array element circuits and driver systems in thin film transistor (TFT) technology. It will be appreciated that the invention could equally be realized using other standard electronic manufacturing processes to realise Active Matrix control, e.g. Complementary Metal Oxide Semiconductor (CMOS), bipolar junction transistors (BJTs), and other suitable processes.

FIGS. 3(a) to 3(d) illustrates problems that may occur when extracting a fluid droplet from a microfluidic device. FIG. 3(a) is a sectional view through a microfluidic device before extraction starts, showing an aqueous droplet 10 that it is desired to extract from the device. For clarity, only the upper and lower substrates 2, 6 of the microfluidic device are shown. As shown in FIG. 3(a), the droplet 10 has been positioned approximately centred underneath an aperture 11 in the upper substrate 2, so that the droplet can be extracted through the aperture 11, for example, using a pipette 18 (only the tip of the pipette 18 is shown). The droplet 10 is surrounded by filler fluid 7.

FIG. 3(b) contains three views at successive times that illustrate how the extraction process would preferably proceed. As can be seen, as the aqueous droplet 10 is extracted from the microfluidic device, the droplet preferably remains centred around the aperture 11 so that the aqueous droplet is drawn out as a single, continuous fluid column. Once all the aqueous fluid has been extracted filler fluid then starts to be extracted, and the process may be stopped at this point.

FIG. 3(c) illustrates one way in which the extraction process cannot proceed as desired. In this example, as the aqueous droplet 10 is extracted from the microfluidic device the droplet does not remain centred about the aperture 11. As a result, filler fluid is pulled under the aperture 11 as shown in the middle view so that the aqueous droplet is not extracted as a continuous whole. Instead, as shown in the right view, the aqueous fluid is extracted in two parts, which are separated by a barrier layer of filler fluid.

Furthermore, if filler fluid is pulled under the extraction aperture 11 during the process of removing the aqueous droplet 10, it is even possible that the aqueous droplet will not be fully extracted. This is shown in FIG. 3(d). In this case, once the filler fluid is drawn under the aperture 11, it blocks the portion 10a of the aqueous droplet remaining in the microfluidic device from being withdrawn through the aperture 11—continued extraction will, in this case, simply result in the extraction of more filler fluid.

Figure 3E:
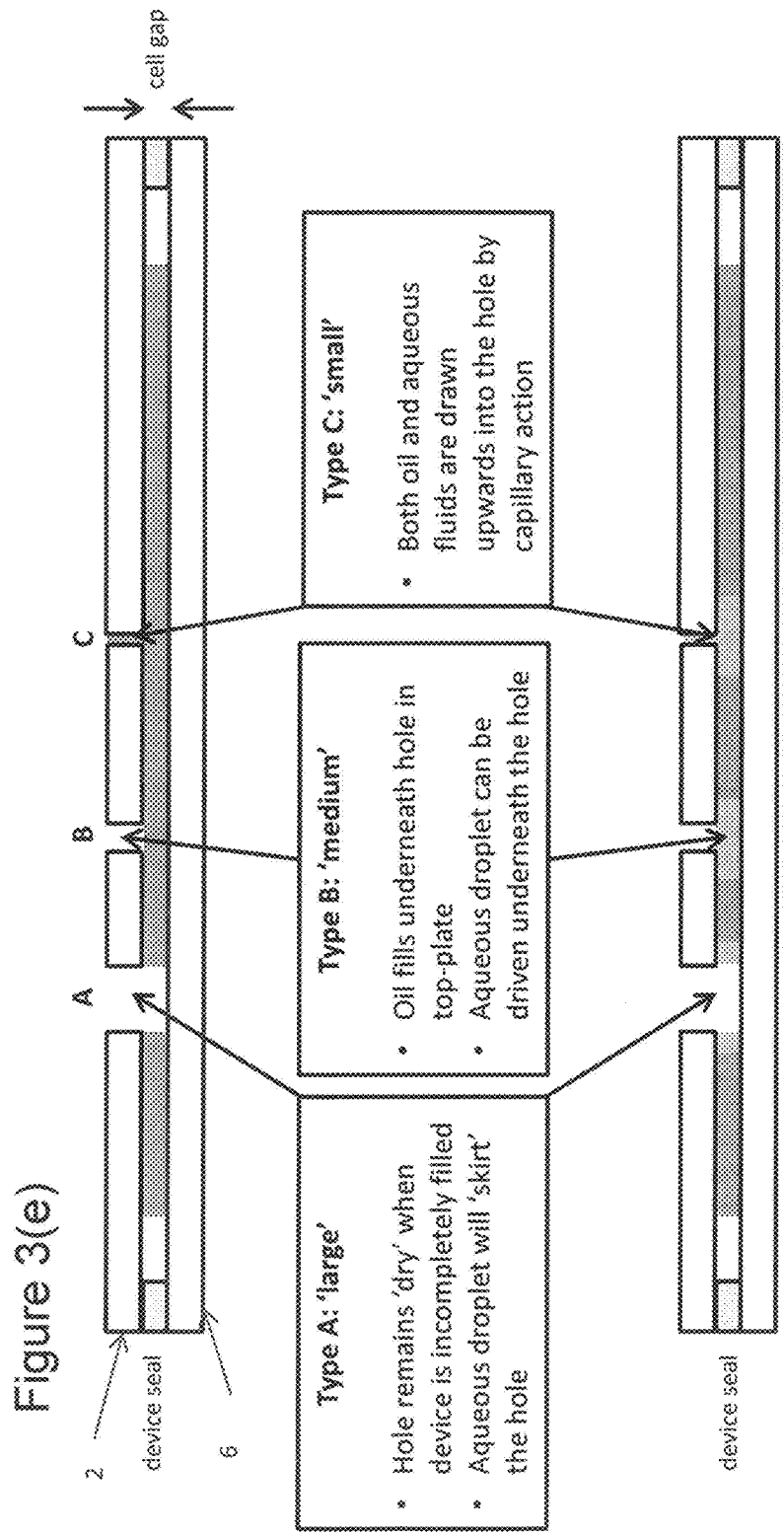
FIG. 3(e) is a schematic section view illustrating behaviour of fluid around apertures of different sizes in the upper substrate of a microfluidic device.

FIG. 3(e) is a cross-section through a schematic microfluidic device, again showing just the upper and low substrates 2, 6 and the seal 9. Three extraction apertures are shown in FIG. 3(e), which illustrates how the behaviour of the fluid within the microfluidic device at or near an aperture depends on the diameter of the aperture.

The upper view in FIG. 3(e) shows the microfluidic device partially filled with filler fluid but before any aqueous fluid has been introduced into the chamber, and the lower view in FIG. 3(e) shows the device after aqueous fluid has further been introduced into the microfluidic device. In the case of a large hole, such as aperture A, the portion of the chamber of the microfluidic device underneath the aperture will remain dry of fluid, both when the device is partially filled with filler fluid and when aqueous fluid has been introduced into the device.

In the case of a "medium" sized aperture, such as aperture B, when the device is partially filled with filler fluid, the filler fluid enters the portion of the device chamber underneath the aperture. When aqueous fluid is introduced into the device chamber, an aqueous droplet can be driven into the part of the device chamber underneath the aperture, as shown in the lower view of FIG. 3(e). The aqueous droplet may then be extracted through the aperture.

If the size of the aperture is "small", such as aperture C, it is possible for the filler fluid to be drawn upwards into the aperture when the chamber of the device is partially filled with filler fluid as shown in the upper view of FIG. 3(e). Similarly, when aqueous fluid is introduced into the device chamber, and is driven to be underneath a small aperture, aqueous fluid is again drawn upwards into the aperture by a capillary action.

Whether an aperture in a device is "large", "medium" or "small" depends on multiple factors, including the cell gap between the substrates of the device, and the properties of the filler fluid and the aqueous fluid (assay fluid). In all cases aqueous fluid will broadly (but not necessarily exactly) follow the behaviour of the filler fluid that it displaces.

Figure 4A:
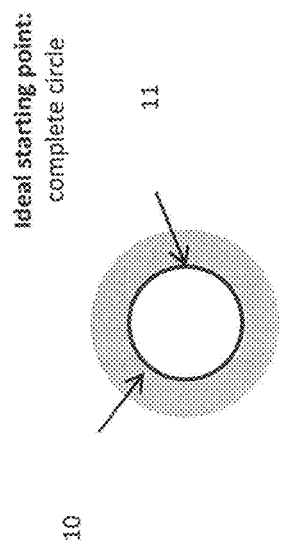
FIGS. 4(a) and 4(b) are a schematic plan view of a microfluidic device illustrating ideal and non-ideal arrangements for fluid extraction.

From the point of view of manufacturing the microfluidic device, it is generally easier to provide large apertures in the upper substrate than it is to provide medium, and particularly small, apertures. However, as can be understood from FIG. 3(e), and as explained more fully in FIGS. 4(a) and 4(b), there may be an additional challenge associated with achieving good extraction of aqueous fluid through a large aperture. Depending on the area of the aqueous fluid droplet in comparison with the area of the aperture, and also whether the aperture is open to atmospheric pressure or not, it may be sometimes be difficult to completely encircle the aperture with the aqueous fluid to be extracted. FIG. 4(a) is a schematic plan view showing the ideal starting point for fluid extraction through a "large" aperture 11—the aqueous fluid 10 completely surrounds the aperture 11 (but, as shown for aperture A in FIG. 3(e), does not occupy the region of the microfluidic device under the aperture 11). Filler fluid (not shown in FIG. 4(a)) is present outside the region occupied by the aqueous fluid 10. Furthermore, the aqueous fluid preferably encircles the aperture in a substantially uniform manner, so that the extent of the aqueous fluid beyond the aperture 11 is substantially constant around the circumference of the aperture. In an ideal case, as aqueous fluid is extracted the ring of aqueous fluid around the aperture shrinks in width but continues to encircle the aperture and good fluid extraction as shown in FIG. 3(b) results—as long as the aqueous fluid 10 completely encircles the aperture it will block filler fluid from reaching the aperture and hence block the extraction of filler fluid via the aperture.

Figure 4B:
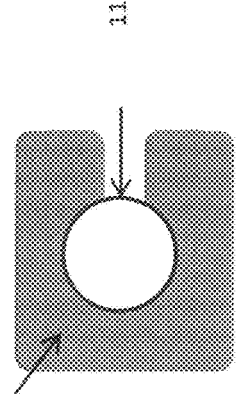

FIG. 4(b) corresponds to FIG. 4(a) but shows a non-ideal situation, in which the aqueous fluid 10 to be extracted does not completely encircle the aperture 11. As can be seen the aqueous fluid 10 to be extracted does not completely extend around the circumference of the aperture 11, and a portion of the circumference of the aperture 11 is free of aqueous fluid 10. As a result, if the fluid arrangement shown in FIG. 4(b) should occur, either at the start of the fluid extraction or during the fluid extraction, it is likely that the fluid extraction will provide either a "broken" extract or an incomplete extract as shown in FIG. 3(c) or FIG. 3(d)—if a portion of the circumference of the aperture 11 is free of aqueous fluid 10, filler fluid (not shown in FIG. 4(b)) makes contact with the aperture and is liable to be extracted.

FIGS. 5(a) to 5(d) are schematic views from above of a microfluidic device illustrating an extraction method according to one embodiment of the invention. FIG. 5(a) shows a fluid droplet 10 that encircles a "large aperture 11", and corresponds generally to FIG. 4(a) in that the droplet encircles the aperture in a substantially uniform manner. FIG. 5(a) shows the fluid droplet 10 before any fluid has been extracted from the microfluidic device. The droplet 10 has been provided at a position in which the droplet 10 completely blocks (or seals) the aperture 11 against filler fluid contained in the fluid space of the EWOD device, for example at a position adjacent to the aperture 11, and so blocks the extraction of filler fluid via the aperture 11. This may be done by any suitable means, for example by standard EWOD methods of manipulating fluid droplets.

In this method, electrodes of the microfluidic device are controlled during fluid extraction via the aperture 11 such as to keep the unextracted portion of the fluid droplet 10 in a desired predetermined location relative to the aperture 11 (for example so that, even as fluid is extracted, the droplet continues to encircle the aperture in a substantially uniform manner) and/or to keep a particular part of the droplet, for example such as its centre, in a desired predetermined location relative to the aperture 11. This maintains the blocking, by the unextracted portion of the fluid droplet 10, of extraction of filler fluid via the aperture 11. This improves the quality of the extraction process, as the blocking of extraction of filler fluid by the unextracted portion of the droplet means that a broken extract or an inefficient extract is much less likely to occur.

It will be understood that, as the fluid extraction proceeds, the unextracted portion of the fluid droplet will decrease in size until it eventually becomes too small to completely encircle the aperture and so maintain complete blocking of extraction of filler fluid. When this happens, filler fluid may start to be extracted in preference to the remaining assay fluid—but this will not happen until almost all of the assay fluid droplet has been extracted. Moreover, even when the unextracted portion of the assay fluid droplet has become too small to completely encircle the aperture, it is desired that the unextracted portion of the fluid droplet remains in contact with the aqueous fluid that has already been extracted from the device (i.e. the droplet is not 'broken'), since maintaining contact with the aqueous fluid that has already been extracted from the device will prevent filler fluid from being extracted instead of aqueous fluid. It is therefore preferable to continue to control the unextracted portion of the fluid droplet 10 via the electrodes of the microfluidic device even after the unextracted portion of the fluid droplet has become too small to completely encircle the aperture, to assist in keeping the unextracted portion of the assay fluid droplet in contact with the aqueous fluid that has already been extracted from the device. In this way, the invention is able to continue to block the extraction of filler fluid after the unextracted portion of the assay fluid droplet has become too small to completely encircle the aperture.

The assay fluid droplet 10 may be controlled in any desired manner to achieve the blocking effect during the fluid extraction process. For example, the electrodes of the microfluidic device may be controlled so as to maintain the droplet approximately centred around the aperture 11 and/or encircling the aperture, even as fluid is extracted and the size of the droplet remaining within the microfluidic device decreases. In FIG. 5(b) the shaded area 12 indicates where electrodes of the microfluidic device are switched on, with the result that the surface of the lower substrate of the device is made less hydrophobic in the region 12. The unextracted droplet 10 will preferentially occupy the region 12 of lower hydrophobicity, as shown in FIG. 5(b). By selecting the size and location of the region 12 where the device electrodes are switched to reduce the hydrophobicity of the surface of the lower substrate, it is therefore possible to maintain the unextracted fluid 10 at a desired location relative to the aperture 11. In particular, if the region 12 where the electrodes are switched on to make the surface of the lower substrate less hydrophobic is approximately centred on the aperture 12, this will ensure that the droplet 10 remains centred on the aperture 11 and continues to encircle the aperture, thereby enabling good extraction of the aqueous droplet.

As the extraction process proceeds, and the size of the aqueous droplet remaining in the device decreases, the region 12 where the electrodes are switched on is made smaller, to ensure that the aqueous fluid 10 remaining in the device is held at its desired location, for example encircling the aperture 11, as shown in FIGS. 5(c) and 5(d).

In principle, the process of maintaining the droplet at a desired location relative to the aperture 11 could be carried out through manual actuation of the electrodes by an operator. However many EWOD devices have a sensing capability, which allows the device to sense whether a particular part of the chamber of the device is occupied by filler fluid or by aqueous fluid. In a particularly preferred embodiment of the invention, therefore, information from sensors in the microfluidic device is supplied to a control unit which controls the area 12 in which the electrodes of the microfluidic device are actuated to make the surface of the lower substrate less hydrophobic. Thus, the sensors of the microfluidic device may determine an area of the chamber of the device that is occupied by aqueous fluid at a given time, and the control unit may then, on the basis of the determined position and/or area of the aqueous fluid droplet, vary the pattern of actuated electrodes. That is, the control unit may determine a region in which the device electrodes should be actuated at a particular time to make the surface of the lower substrate less hydrophobic, based on the determined position and/or area of the fluid droplet at that time. This process of determining the position and shape of the aqueous fluid droplet and determining an appropriate region 12 within which to actuate the device electrodes can be repeated as the aqueous fluid is extracted from the device, in order to maintain the aqueous fluid remaining within the chamber of the device centred around the aperture 11 or at any other desired position. This process may be carried out automatically, for example under computer control, without the need for manual intervention.

As an example, the electrodes may be controlled so that the area 12 of the device in which electrodes are actuated to make the surface of the lower substrate less hydrophobic has an area that is a predetermined fraction (where the fraction is less than 1) of the determined area of the droplet still remaining within the device, for example has an area that is between 0.5 and 0.8 of the determined area of the droplet still remaining within the device. This is shown in FIG. 5(b) example, in which the area 12 in which electrodes are actuated is smaller than the droplet. It has been found that making the area of the region 12 where the electrodes are actuated smaller than the area of the aqueous droplet 10 improves the control that can be exerted over the position of the aqueous fluid droplet 10. In this example, after a determination of the size of the droplet still remaining within the device is made, the determined droplet area is multiplied by the predetermined fraction to calculate the required area over which the electrodes are actuated. Electrodes are then actuated in a region having an area equal to the calculated area, for example in a generally circular region having an area equal to the calculated area (centred for example on the extraction hole).

The more frequently the determination of the position and shape of the aqueous fluid droplet is carried out, the greater are the chances of efficient extraction. Preferably the determination is carried out at least once per second.

In the absence of sensing capability in a particular microfluidic device, control of the position of fluid in the device could alternatively be effected by varying the pattern of actuated electrodes in a predetermined manner with time. This may for example be done using a timed sequence of applied electrode patterns, shrinking the area over which electrodes are actuated at a rate suitable for a typical fluid extraction rate. Conveniently, this embodiment may be implemented using a look-up table, which stores details of which electrodes of the device should be actuated at a given time since the start of the extraction.

In a modified version of these embodiments, once the area of the droplet remaining within the device drops below a certain size (e.g. below an area equal to a few electrowetting electrodes), the actuation of the electrodes can be completely switched off.

FIGS. 6(a) to 6(c) are schematic plan views illustrating a further method of the present invention of positioning fluid for, and/or during, extraction. This method relates to the initial positioning of a fluid droplet 10 that is to be extracted such that it encircles the aperture 11. The droplet is manipulated by actuating electrodes in a particular region 13 of the chamber of the microfluidic device, so as to make the surface of the lower substrate in that portion of the chamber less hydrophobic and cause the droplet to preferentially wish to occupy that region. The region 13 in which the electrodes are actuated is controlled to change over time, in order to move the droplet towards the aperture 11 such that it encircles the aperture, as shown in FIG. 6(c).

In the method of FIGS. 6(a) to 6(c), the region 13 which the electrodes are actuated is set to be less than the area of the droplet 10. As noted, it has been found that making the area of the region 13 where the electrodes are actuated smaller than the area of the aqueous droplet 10 improves the control that can be exerted over the position of the aqueous fluid droplet 10.

As in the previous embodiment, the method of FIG. 6(a) to FIG. 6(c) can be combined with sensing of the position of the aqueous fluid droplet 10, if the microfluidic device has a sensing capability. Sensed information on the position and size of the droplet can be supplied to a control system which, based on the supplied information, controls the region 13 in which the electrodes are actuated so as to ensure that the region 13 remains smaller than the area occupied by the droplet, and/or to ensure that the droplet 10 is being moved towards the aperture 11 through which it is desired to extract the droplet.

Figure 7A:
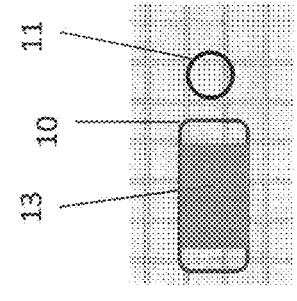
FIGS. 7(a), 7(b), and 7(c) are schematic plan views illustrating another method of the present invention of positioning fluid for extraction.
Figure 7B:
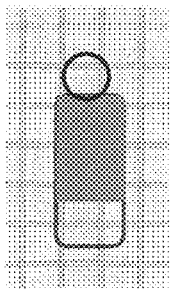
Figure 7C:
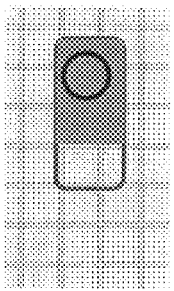
Figure 7D:
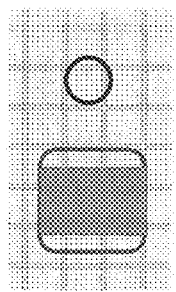
FIGS. 7(d), 7(e), and 7(f) are schematic plan views illustrating a comparative method of positioning fluid for extraction.
Figure 7E:
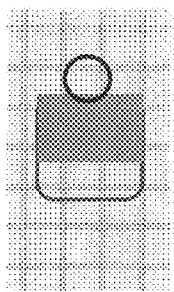
Figure 7F:
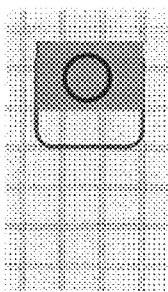

FIGS. 7(a)-7(f) illustrate a further method of the present invention of positioning fluid for, or during, extraction. FIGS. 7(a)-7(c) correspond to FIGS. 6(a) to 6(c) respectively, and illustrate the position of the aqueous droplet 10 being controlled by actuating electrodes in an appropriate region 13 of the chamber of the microfluidic device. As can be seen in FIGS. 7(a) to 7(c), the region 13 in which the electrodes are actuated is greater in the direction of travel of the droplet (to the right in FIG. 7(a)), than it is in a direction perpendicular to the direction of travel of the droplet (upwards in FIG. 7(a)). Again, it has been found that this improves the degree of control that can be exerted over the movement and positioning of the aqueous fluid droplet 10. In contrast, if the region 13 in which the electrodes are actuated is shorter in the direction of travel of the droplet than it is in a direction perpendicular to the direction of travel, as shown in FIGS. 7(d)-7(f), the degree of control that is possible is less.

Although FIGS. 7(a)-7(c) show both that the area of the region 13 in which the electrodes are actuated is smaller than the area occupied by the droplet, and is longer in the direction of travel of the droplet than in a perpendicular direction, the embodiment of FIGS. 7(a)-7(c) could alternatively be applied with an electrode pattern that was not smaller than the area occupied by the droplet.

FIGS. 8(a)-8(c) are schematic plan views of a microfluidic device illustrating a further method of the present invention of positioning fluid for, and/or during, extraction. In this method, multiple aqueous fluid sub-droplets 10a-10d are positioned around an extraction aperture 11, as shown in FIG. 8(a). Each sub-droplet 10a-10d is then moved closer to the aperture 11 (FIG. 8(b)), so that the sub-droplets merge to form a single, larger droplet that encircles the aperture 11 (FIG. 8(c)). Each sub-droplet 10a-10d may be moved and positioned by actuating electrodes in a respective area 13a-13d of the microfluidic device.

The embodiment of FIGS. 8(a) to 8(c) may be combined with one or both of the embodiments of FIGS. 6(a)-6(c) and 7(a)-7(c). That is, an area 13a-13d in which electrodes are actuated may be smaller than the area occupied by a respective sub-droplet 10a-10d, and/or may be longer in the direction of travel of the respective sub-droplet 10a-10d than in a direction perpendicular to the direction of the travel of the respective sub-droplet 10a-10d.

As with the previous embodiments, the embodiment of FIGS. 8(a)-8(d) may make use of sensing capability, if present, of the microfluidic device to determine the positions of the aqueous fluid droplets 10a-10d, and control the areas 13a-13d in which the electrodes are actuated on the basis of the determined positions of the aqueous fluid droplets. Alternatively, the electrodes of the device may be selectively actuated according to a timed sequence of electrode patterns.

The methods described above may be implemented using the electrodes provided on a standard microfluidic device. Generally, the microfluidic device will contain electrodes that are square or rectangular, and that are arranged in an array of row or columns. Provided that these electrodes are small compared to the typical droplet sizes, it is possible to provide good control of the movement and position of a droplet by actuating electrodes in the region of the chamber in order to reduce the hydrophobicity of the surface of the lower substrate in that region.

In an alternative embodiment of the invention, a microfluidic device is provided with one or more "extraction electrodes" for use specifically in extracting aqueous fluid from the device. This embodiment is illustrated in FIG. 9(a), which is a schematic plan view from above. The extraction electrode comprises at least one electrode 14 that encircles the aperture 11. Once aqueous fluid 10 has been driven to encircle the aperture, the electrode 14 may be actuated to reduce the hydrophobicity of the portion of the surface of the lower substrate corresponding to the electrode 14, and cause the aqueous fluid 10 to preferentially occupy that region. Since the extraction electrode 14 encircles the aperture 11, the aqueous fluid is caused to remain encircling the aperture even as fluid is extracted.

This embodiment is not limited to use of a single extraction electrode that encircles the aperture, and FIG. 9 shows two further extraction electrodes 15, 16 provided inside the extraction electrode 14. Each extraction electrode encircles or substantially encircles the aperture 11. (It will be understood that, if the electrodes 14, 14', 15, 16 and the leads 14a, 14b, 15a, 16a, to the electrodes are defined in a single conductive layer, only the innermost extraction electrode 16 can completely encircle the aperture 11. The second most inner extraction electrode 15 must necessarily have a gap to accommodate the lead 16a to the innermost extraction electrode 16, and the third most inner extraction electrode 14, 14' must necessarily have two gaps to accommodate the leads 15a, 16a to the second most inner extraction electrode 15 and the innermost extraction electrode 16).

In use, once aqueous fluid 10 has been driven to encircle the aperture as shown in FIG. 9(*b*), all extraction electrodes 14, 14', 15 and 16 would initially both be actuated, but as fluid was extracted and the size of the droplet remaining in the device reduced, electrode 14, 14' would at some point be switched off so that only the inner two electrodes 15, 16 were actuated. As fluid extraction continued and the size of the droplet remaining in the device reduced further, electrode 15 would at some subsequent point be switched off so that only the innermost extraction electrode 116 was actuated, The embodiment of FIG. 9 allows the shape of the fluid droplet 10 to be controlled so that the droplet continues to encircle the aperture 11 even as fluid is extracted, thereby ensuring good extraction of the fluid. This embodiment may be used with both an active matrix microfluidic device, such as AM-EWOD device, or with a passive matrix microfluidic device.

As for the embodiment of FIG. 5, if the microfluidic device has a sensing capability, the actuation of the extraction electrodes may be controlled on the basis of a sensed position of the fluid 10 to be extracted—for example information from sensors in the microfluidic device may supplied to a control unit which controls which of the extraction electrodes of the microfluidic device are actuated to make the surface of the lower substrate less hydrophobic. The process of determining the position and shape of the aqueous fluid droplet and determining which of the extraction electrodes of the microfluidic device are actuated can be repeated as the aqueous fluid is extracted from the device. This process may be carried out automatically, for example under computer control, without the need for manual intervention.

Alternatively, for example in a device not having a sensing capability, control of which extraction electrodes are actuated could alternatively be effected using a timed sequence of applied electrode patterns, shrinking the actuated area at a rate suitable for a typical extraction rate.

The embodiment of FIG. 9 may be applied independently of other embodiments described in this application. Alternatively, the embodiment of FIG. 9 may be combined with one or more of the previous embodiments—for example the droplet 10 may initially be positioned using a method as shown in FIG. 6(*a*)-6(*c*), 7(*a*)-7(*c*) or 8(*a*)-8(*c*) using the conventional electrode provided on a microfluidic device, after which the extraction electrode(s) of FIG. 9 is/are used to control the position of the droplet during the process of extracting fluid from the device.

The embodiment of FIG. 9(*a*) is particularly (but not exclusively) suitable for use in a passive matrix microfluidic device. The embodiment of, for example, FIGS. 5(*a*)-5(*c*) can be applied in an active matrix device (since the electrodes in a typical active matrix device make it possible to apply almost arbitrary electrode patterns), but a passive matrix device typically has a much smaller number of larger, individually addressed electrodes. In the vicinity of an extraction hole, the electrodes of a passive matrix device could be designed to include one or more electrodes encircling the aperture as shown in FIG. 9, to mimic the effects obtainable in an active matrix device using this invention.

The invention has been described with reference to extraction of fluid from a microfluidic device through an aperture in the upper substrate 2 of the device as indicated in FIG. 10(*a*). The invention is not, however, limited to this. The provision of apertures in the upper substrate of a microfluidic device can be undesirable, since the substrate is typically made of glass and it is possible to damage the substrate when drilling extraction holes in the substrate. It is therefore possible to provide a microfluidic device in which the upper substrate is not continuous, but contains a central glass portion 2 bounded by one or more portions made of a material in which apertures can more easily be formed, such as a plastics material 16. Providing the apertures in the adjacent portion(s) 16 as shown in FIG. 10(*b*) avoids the needs to provide apertures in the glass substrate 2, and is therefore expected to increase the yield of the manufacturing process.

Alternatively, as shown in FIG. 10(*c*) the upper substrate 2 may be co-extensive with the fluid chamber, but be smaller than the lower substrate 6. Fluid can then be loaded into, or extracted from, a side of the device, through apertures provided in the spacer 9 between the upper and lower substrates (the spacer 9 is not shown in FIG. 10(*c*), which is a cross-section through the device at a position where apertures are provided in the spacer 9). When extracting fluid from a device as shown in FIG. 10(*c*), it is again preferable to maintain the aqueous fluid droplet so that it blocks extraction of filler fluid via the aperture in the spacer 9, and any of the embodiments described above may be used to do this.

For example it would be possible to apply a method generally similar to that of FIGS. 5(*a*)-5(*d*), where the centre of the region 12 in which electrodes are actuated is placed at the centre of the aperture of the spacer 9 (or possibly slightly outside the bounds of the upper substrate). The region 12 in which electrodes are actuated could still be generally circular, since it would not matter if electrodes were actuated outside the bounds of the upper substrate. Alternatively, the region in which electrodes are actuated could be confined to be within the bounds of the upper substrate, so that the region in which electrodes are actuated would be approximately one half of the region shown in FIGS. 5(*a*)-5(*d*).

In the case of a passive matrix device, an electrode pattern as described with reference to FIG. 9(*a*) could for example be provided since it would again not matter if electrodes were actuated outside the bounds of the upper substrate. Alternatively, an electrode pattern in which electrodes are confined to be within the bounds of the upper substrate could be used, for example a pattern in which the electrodes have the form of semi-circular arcs having their centre approximately coincident with the aperture.

Figure 11A:
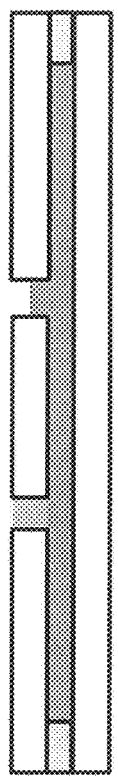
FIGS. 11(a) and 11(b) are schematic sectional views of a microfluidic device illustrating a further embodiment of the invention.
Figure 11B:
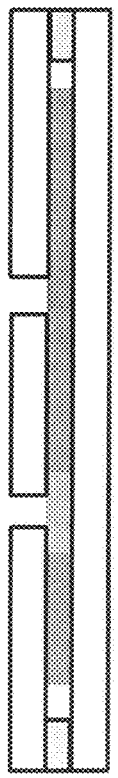

FIGS. 11(a) and 11(b) illustrate a further technique that may be used with methods of the invention as described above, to further improve the changes of obtaining the unbroken extraction of FIG. 3(b). This embodiment is a means of encouraging efficient extraction by initially providing (FIG. 11(a)) a droplet of assay fluid that is adjacent to an aperture in the cell and blocks the aperture against extraction of filler fluid via the aperture, and causing the assay fluid droplet to maintain the blocking of extraction of filler fluid according to any method of the invention as described herein while fluid is drawn from the device, so as to favour the extraction of the assay fluid and prevent a "broken" extraction or an "inefficient" extraction. This embodiment further comprises introducing extra filler fluid into the cell, so that the droplet to be extracted is under slightly more pressure and so is pressured to exit the device. This further favours the extraction of assay fluid from the cell over the extraction of filler fluid. In contrast, with an incompletely filled device as shown in FIG. 11(a) there is less incentive for assay fluid to exit the device. In this embodiment the extra filler fluid can be introduced before extraction of assay fluid starts. In principle the introduction of extra filler fluid could continue during extraction of assay fluid, although this may not always be practical.

FIGS. 12 and 13(a)-(f) show a further embodiment of the invention, showing how the method could be applied to a device configuration whereby the extract port is formed at the side of the device. An exemplary construction of the device is shown in FIG. 12, shown in plan-view. The upper substrate 12 has an edge that intersects the electrode array 100. The spacer 9 (hatched markings) has a geometry such that an extract port region 101 is defined beyond the edge of the upper substrate 12 and inside the spacer. The extract port is configured such that fluid may be extracted from the device by transporting (by electro-wetting) a droplet of fluid through the array to the region 101 and then performing extraction as previously described (e.g. by means of a pipette).

Accordingly, this embodiment provides a series of actuation patterns suitable for performing extraction through the side of the EWOD device (FIGS. 13a-d).

Figure 13C:
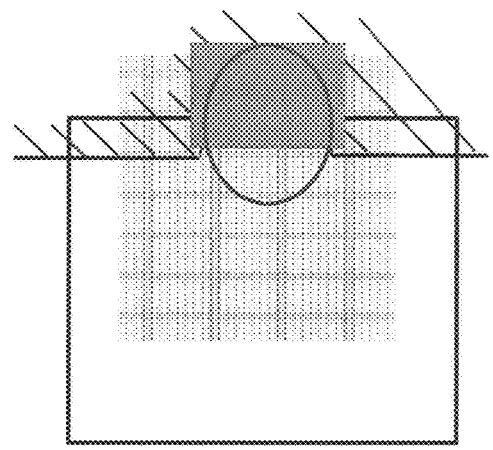
FIGS. 13(a), 13(b), 13(c), 13(d), 13(e), and 13(f) are schematic plan views illustrating a method of fluid positioning for extraction for a device with a side extraction structure.
Figure 13B:
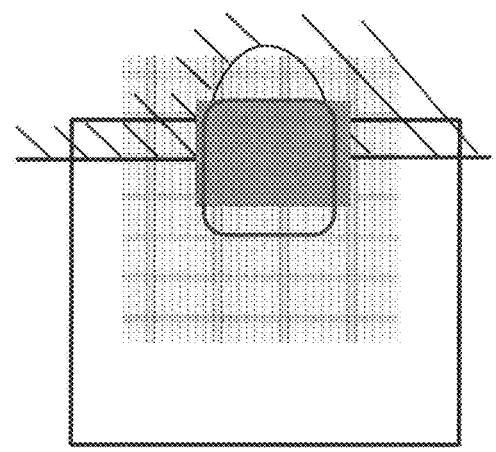
Figure 13A:
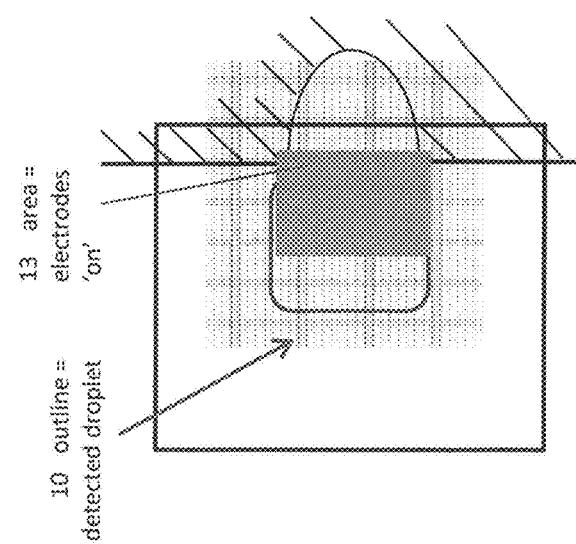
Figure 13F:
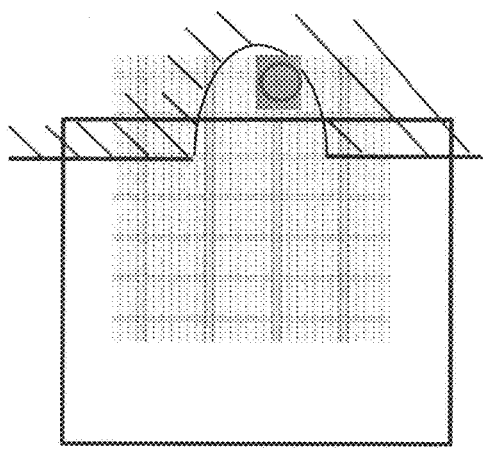
Figure 13E:
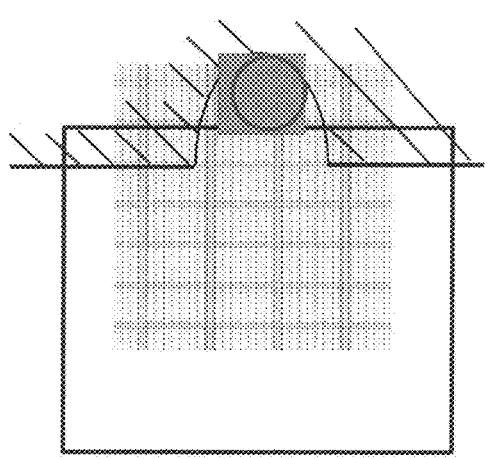
Figure 13D:
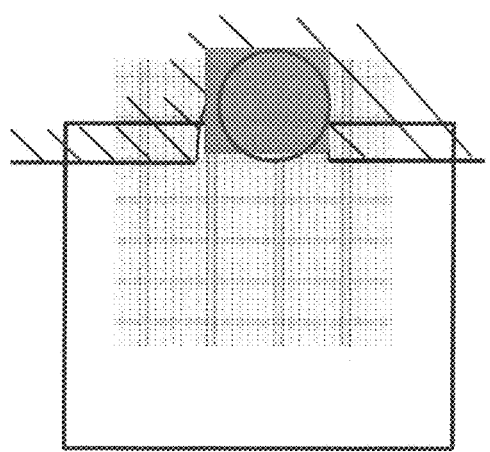

Initially (FIG. 13a) the droplet is transported as normal, by electro-wetting actuation to the vicinity of the extract port. In subsequent steps, (FIG. 13b) the actuation pattern is moved in discrete steps until the actuation pattern extends beyond the edge of the top plate and into the region of the extract port. The droplet continues to follow the actuation pattern until it reaches the spacer, which constrains its position into that of the extract port (FIG. 13c). At this point liquid may be withdrawn from the extract port (e.g. by pipette). The device then operates using feedback as previously described, applying an actuation pattern in accordance with the (feedback) sensor pattern detected such that (for example) a rectangular pattern of steadily decreasing size is applied centred around the centroid of the droplet. This sequence of patterns therefore realise the advantages previously described, that all of the liquid can be extracted with a minimal amount of unwanted fluid taken up into the pipette.

An advantage of this embodiment is that it applies the method of the invention to a side extraction design of cartridge. Such a design may be favourable since it does not require the production of holes in the top substrate and may therefore be simpler and lower cost to manufacture.

The invention claimed is:

1. A method of extracting assay fluid from an electrowetting on dielectric (EWOD) device, the EWOD device comprising two opposing substrates defining a fluid space there between and an aperture for extraction of fluid from the fluid space;
the method comprising:
providing, in the fluid space of the EWOD device, an assay fluid droplet adjacent to the aperture such that the assay fluid droplet blocks extraction of filler fluid contained in the fluid space of the EWOD device, and
extracting, via the aperture, at least some of the assay fluid of the assay fluid droplet from the fluid space;
wherein the method comprises, during the extracting, controlling the assay fluid droplet by electrowetting to maintain the blocking of extraction of filler fluid;
wherein the EWOD device comprises a plurality of electrowetting electrodes, and the method comprises selectively actuating the electrowetting electrodes in a pattern of actuated electrodes during the extracting to maintain the blocking of extraction of filler fluid; and
the method further comprises, during the extracting, varying the pattern of actuated electrodes over time to maintain the blocking of extraction of filler fluid.

2. A method as claimed in claim 1 and comprising, during the extracting, controlling the assay fluid droplet by electrowetting so as to keep the centre of the assay fluid droplet substantially at a predetermined position relative to the aperture.

3. A method as claimed in claim 1 and comprising, during the extracting, varying the pattern of actuated electrodes over time in a predetermined manner.

4. A method as claimed in claim 1 and comprising, during the extracting, varying the pattern of actuated electrodes over time in dependence on a sensed position and/or size of the assay fluid droplet.

5. A method as claimed in claim 1 wherein providing the assay fluid droplet comprises moving assay fluid to the vicinity of the aperture by electrowetting.

6. A method as claimed in claim 5, and comprising moving the assay fluid by actuating electrodes within an area that is smaller than the area of the assay fluid droplet.

7. A method as claimed in claim 5, and comprising moving the assay fluid by actuating electrodes within an area having a dimension parallel to a direction of movement of the assay fluid that is greater than a dimension perpendicular to the direction of movement of the assay fluid.

8. A method as claimed in claim 5 wherein providing the assay fluid droplet comprises moving a plurality of sub-droplets of assay fluid to the vicinity of the aperture and merging the sub-droplets to form the assay fluid droplet for blocking extraction of filler fluid via the aperture.

9. A method as claimed in claim 1 and further comprising introducing additional filler fluid into the fluid space of the EWOD device before the extracting.

10. A method of extracting assay fluid from an electrowetting on dielectric (EWOD) device, the EWOD device comprising two opposing substrates defining a fluid space there between and an aperture for extraction of fluid from the fluid space;
the method comprising:
providing, in the fluid space of the EWOD device, an assay fluid droplet adjacent to the aperture such that the assay fluid droplet blocks extraction of filler fluid contained in the fluid space of the EWOD device, and
extracting, via the aperture, at least some of the assay fluid of the assay fluid droplet from the fluid space;

wherein the method comprises, during the extracting, controlling the assay fluid droplet by electrowetting to maintain the blocking of extraction of filler fluid, and wherein the opposing substrates include an upper substrate and a lower substrate separated by a spacer, and the aperture is formed in a region beyond an edge of the upper substrate and inside the spacer, the method further comprising transporting by electrowetting the assay fluid droplet to the region.

11. A method as claimed in claim 10, wherein transporting by electrowetting the assay fluid droplet to the region comprises moving an actuation pattern of electrowetting electrodes beyond the edge of the upper substrate and into the region.

12. A method as claimed in claim 11, wherein the actuation pattern is moved until the actuation pattern reaches the spacer.

13. An electrowetting on dielectric (EWOD) device comprising:

two opposing substrates defining a fluid space therebetween;

an aperture for extraction of fluid from the fluid space;

a plurality of independently actuatable electrowetting electrodes; and an electrode control unit configured to apply actuation voltages to the independently actuatable electrowetting electrodes;

wherein the independently actuatable electrowetting electrodes comprise active matrix electrowetting electrodes;

wherein the electrode control unit is configured to apply actuation voltages to actuate the independently actuatable electrowetting electrodes so as to:

provide, in the fluid space of the EWOD device, a droplet of assay fluid adjacent to the aperture such that the droplet blocks extraction of filler fluid contained in the fluid space of the EWOD device, and control the assay fluid droplet by electrowetting during extraction, via the aperture, of at least some of the assay fluid of the droplet from the fluid space so as to maintain the blocking of extraction of filler fluid.

14. An EWOD device as claimed in claim 13 wherein the aperture is in one of the substrates of the EWOD device.

15. An EWOD device of claim 13, wherein the aperture is at a side of the EWOD device.

16. An EWOD device of claim 15, wherein the opposing substrates include an upper substrate and a lower substrate separated by a spacer, and the aperture is formed in a region beyond an edge of the upper substrate and inside the spacer.

* * * * *